(12) United States Patent
Matsukura et al.

(10) Patent No.: US 10,270,424 B2
(45) Date of Patent: Apr. 23, 2019

(54) ACOUSTIC WAVE RESONATOR, FILTER, MULTIPLEXER, AND METHOD OF FABRICATING ACOUSTIC WAVE RESONATOR

(71) Applicant: TAIYO YUDEN CO., LTD., Tokyo (JP)

(72) Inventors: Fumiya Matsukura, Tokyo (JP); Kentaro Nakamura, Tokyo (JP); Takashi Matsuda, Tokyo (JP); Jun Tsutsumi, Tokyo (JP); Junichi Hamasaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 126 days.

(21) Appl. No.: 15/451,667

(22) Filed: Mar. 7, 2017

(65) Prior Publication Data

US 2017/0279433 A1    Sep. 28, 2017

(30) Foreign Application Priority Data

Mar. 22, 2016   (JP) ................................ 2016-057196

(51) Int. Cl.
*H03H 9/64*   (2006.01)
*H03H 9/02*   (2006.01)
(Continued)

(52) U.S. Cl.
CPC ............ *H03H 9/6489* (2013.01); *H03H 3/04* (2013.01); *H03H 9/02889* (2013.01);
(Continued)

(58) Field of Classification Search
CPC .... H03H 9/6489; H03H 3/08; H03H 9/02881; H03H 9/02889; H03H 9/14541;
(Continued)

(56) References Cited

U.S. PATENT DOCUMENTS 9,065,424 B2 *   6/2015   Nakanishi .......... H03H 9/02559
2003/0214369 A1 *  11/2003   Kearns ................ H03H 9/0038
                                                    333/133
(Continued)

FOREIGN PATENT DOCUMENTS

JP      H02-295211 A     12/1990
JP      2005-142629 A    6/2005
(Continued)

OTHER PUBLICATIONS

Wikipedia "Silicon Nitride", https://en.wikipedia.org/wiki/Silicon_nitride accessed on Aug. 22, 2018.*
(Continued)

*Primary Examiner* — Robert J Pascal
*Assistant Examiner* — Jorge L Salazar, Jr.
(74) *Attorney, Agent, or Firm* — Chen Yoshimura LLP

(57)   ABSTRACT

An acoustic wave resonator includes: a piezoelectric substrate; an IDT located on the piezoelectric substrate and including comb-shaped electrodes facing each other, each of the comb-shaped electrodes including: electrode fingers exciting an acoustic wave; and a bus bar to which the electrode fingers are connected; a dielectric film located on the piezoelectric substrate in an overlap region, where the electrode fingers of one of the comb-shaped electrodes and the electrode fingers of the other overlap, so as to cover the electrode fingers; and an additional film located on the dielectric film in the overlap region and having a density greater than that of the dielectric film, and of which a film thickness in edge regions corresponding to both edges of the overlap region in an extension direction of the electrode fingers is greater than a film thickness in a central region sandwiched between the edge regions in the overlap region.

13 Claims, 13 Drawing Sheets

(51) Int. Cl.
*H03H 9/145* (2006.01)
*H03H 3/04* (2006.01)
*H03H 9/60* (2006.01)

(52) U.S. Cl.
CPC ........ *H03H 9/14541* (2013.01); *H03H 9/605* (2013.01); *H03H 9/64* (2013.01); *H03H 9/02559* (2013.01); *H03H 2003/0414* (2013.01)

(58) Field of Classification Search
CPC ............ H03H 9/605; H03H 3/04; H03H 9/64; H03H 2003/0414; H03H 9/02559
USPC .......................................... 333/133, 193–196
See application file for complete search history.

(56) References Cited

U.S. PATENT DOCUMENTS

2007/0080611 A1* 4/2007 Yamada ................... H03H 3/02
310/364
2012/0161577 A1* 6/2012 Abbott ............... H03H 9/02858
310/313 C
2013/0249647 A1 9/2013 Nakanishi et al.

FOREIGN PATENT DOCUMENTS

| | | |
|---|---|---|
| JP | 2011-124823 A | 6/2011 |
| JP | 2012-186808 A | 9/2012 |
| JP | 2013-138333 A | 7/2013 |
| JP | 2013-544041 A | 12/2013 |

OTHER PUBLICATIONS

Wikipedia "Silicon Dioxide", https://en.wikipedia.org/wiki/Silicon_dioxide accessed on Aug. 22, 2018.*
Wikipedia "Tantalum Oxide", https://en.wikipedia.org/wiki/Tantalum_pentoxide accessed on Aug. 22, 2018.*
Wikipedia "Niobium Oxide", https://en.wikipedia.org/wiki/Niobium_pentoxide accessed on Aug. 22, 2018.*
Japanese Office Action dated Mar. 6, 2018, in a counterpart Japanese patent application No. 2016-057196. (A machine translation (not reviewed for accuracy) attached.).

* cited by examiner

ACOUSTIC WAVE RESONATOR, FILTER, MULTIPLEXER, AND METHOD OF FABRICATING ACOUSTIC WAVE RESONATOR

CROSS-REFERENCE TO RELATED APPLICATION

This application is based upon and claims the benefit of priority of the prior Japanese Patent Application No. 2016-057196, filed on Mar. 22, 2016, the entire contents of which are incorporated herein by reference.

FIELD

A certain aspect of the present invention relates to an acoustic wave resonator, a filter, a multiplexer, and a method of fabricating the acoustic wave resonator.

BACKGROUND

In high frequency communication systems typified by mobile phones, high-frequency filters are used to remove unnecessary signals other than signals in the frequency band used for communication. Acoustic wave resonators such as surface acoustic wave (SAW) resonators have been used for the high-frequency filters. In the SAW resonator, an Interdigital Transducer (IDT) including electrode fingers is formed on a piezoelectric substrate such as a lithium tantalate ($LiTaO_3$) substrate or a lithium niobate ($LiNbO_3$) substrate.

It has been known that a dielectric film covering the IDT is provided, and the dielectric film in the edge regions corresponding to both edges of an overlap region in which the electrode fingers overlap is made to be thicker than the dielectric film in the central region as disclosed in Japanese Patent Publication Application No. 2013-544041 (Patent Document 1).

The technique disclosed in Patent Document 1 can reduce transverse-mode spurious. However, the frequency adjustment is not easy in the structure of Patent Document 1. For example, when a frequency adjusting film is formed on the dielectric film, the frequency adjusting film is not uniformly formed because of the level difference of the dielectric film and/or the level difference of the electrode fingers, and the transverse-mode spurious occurs.

SUMMARY OF THE INVENTION

According to a first aspect of the present invention, there is provided an acoustic wave resonator including: a piezoelectric substrate; an IDT that is located on the piezoelectric substrate and includes a pair of comb-shaped electrodes facing each other, each of the pair of comb-shaped electrodes including: electrode fingers exciting an acoustic wave; and a bus bar to which the electrode fingers are connected; a dielectric film that is located on the piezoelectric substrate in an overlap region, in which the electrode fingers of one of the pair of comb-shaped electrodes and the electrode fingers of another one of the pair of comb-shaped electrodes overlap, so as to cover the electrode fingers; and an additional film that is located on the dielectric film in the overlap region and has a density greater than a density of the dielectric film, and of which a film thickness in edge regions corresponding to both edges of the overlap region in an extension direction of the electrode fingers is greater than a film thickness in a central region sandwiched between the edge regions in the overlap region.

According to a second aspect of the present invention, there is provided a filter including the above acoustic wave resonator.

According to a third aspect of the present invention, there is provided a multiplexer including the above filter.

According to a fourth aspect of the present invention, there is provided a method of fabricating an acoustic wave resonator, the method including: forming an IDT including a pair of comb-shaped electrodes facing each other on a piezoelectric substrate, each of the pair of comb-shaped electrodes including: electrode fingers exciting an acoustic wave; and a bus bar to which the electrode fingers are connected; forming a dielectric film on the piezoelectric substrate in an overlap region, in which the electrode fingers of one of the pair of comb-shaped electrodes and the electrode fingers of another one of the pair of comb-shaped electrodes overlap, so that the dielectric film covers the electrode fingers; forming, on the dielectric film in the overlap region, an additional film that has a density greater than a density of the dielectric film and of which a film thickness in edge regions corresponding to both edges of the overlap region in an extension direction of the electrode fingers is greater than a film thickness in a central region sandwiched between the edge regions in the overlap region; and thinning the additional film substantially uniformly.

DETAILED DESCRIPTION

Hereinafter, a description will be given of embodiments of the present invention with reference to the accompanying drawings.

First Embodiment

Figure 1A:
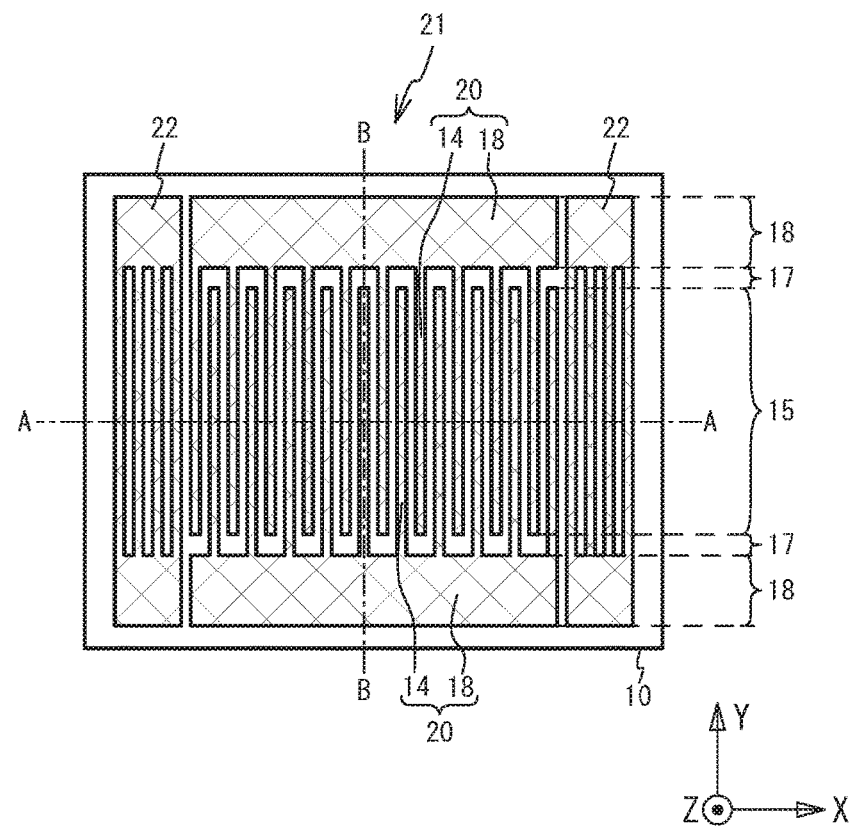
FIG. 1A is a plan view of an acoustic wave resonator in accordance with a first embodiment.
Figure 1B:
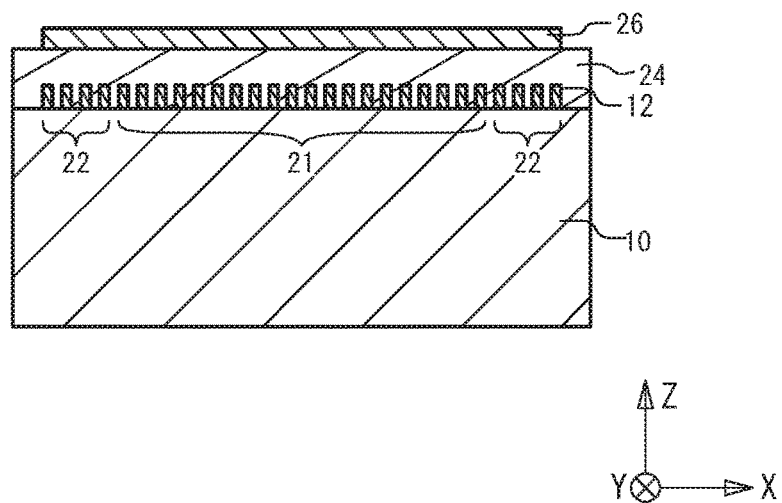
FIG. 1B is a cross-sectional view taken along line A-A in FIG. 1A.

FIG. 1A is a plan view of an acoustic wave resonator in accordance with a first embodiment, and FIG. 1B is a cross-sectional view taken along line A-A in FIG. 1A. In FIG. 1A, the illustration of a dielectric film and an additional film is omitted. As illustrated in FIG. 1A and FIG. 1B, an Interdigital Transducer (IDT) 21 and reflectors 22 are formed on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes electrode fingers 14 and a bus bar 18 to which the electrode fingers 14 are connected. The pair of comb-shaped electrodes 20 are located so as to face each other so that the electrode fingers 14 of one of the comb-shaped electrodes 20 and the electrode fingers 14 of the other are arranged substantially in an alternate order.

The region where the electrode fingers 14 of the pair of comb-shaped electrodes 20 overlap is an overlap region 15. In the overlap region 15, an acoustic wave excited by the electrode fingers 14 mainly propagates in the alignment direction of the electrode fingers 14. The pitch of the electrode fingers 14 is approximately equal to the wavelength $\lambda$ of the acoustic wave. The region between the tips of the electrode fingers 14 of one of the comb-shaped electrodes 20 and the bus bar 18 of the other is a gap region 17. When dummy electrode fingers are provided, the gap region is a region between the tips of the electrode fingers of one of the comb-shaped electrodes 20 and the tips of the dummy electrode fingers of the other.

A dielectric film 24 is located on the piezoelectric substrate 10 so as to cover the electrode fingers 14. An additional film 26 is located on the dielectric film 24. The propagation direction of the acoustic wave is defined as an X direction, and a direction perpendicular to the propagation direction is defined as a Y direction. The X direction and the Y direction do not always correspond to the X-axis direction and the Y-axis direction of the crystal orientation of the piezoelectric substrate 10, respectively. The piezoelectric substrate 10 is, for example, a lithium tantalate substrate or a lithium niobate substrate. The metal film 12 is, for example, an aluminum film or a copper film. The dielectric film 24 is, for example, a silicon oxide film. Alternatively, the dielectric film 24 is a silicon oxide film containing fluorine or the like. The additional film 26 is, for example, an insulating film such as a tantalum oxide film or a niobium oxide film, or a metal film such as a tungsten oxide film, a tellurium oxide film, or a titanium oxide film.

Figure 2A:
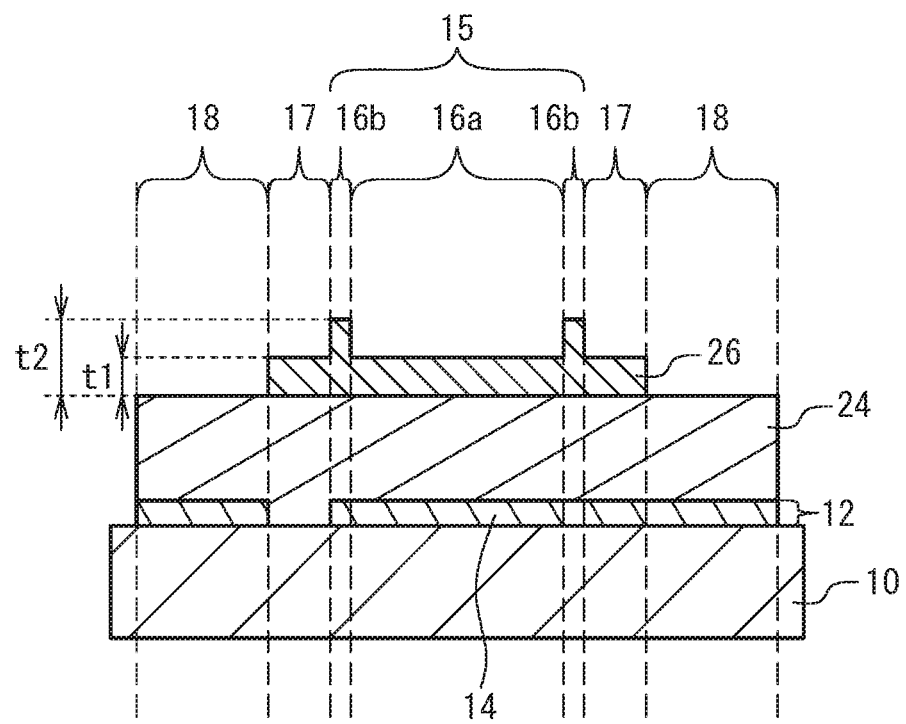
FIG. 2A is a cross-sectional view taken along line B-B in FIG. 1A.
Figure 2B:
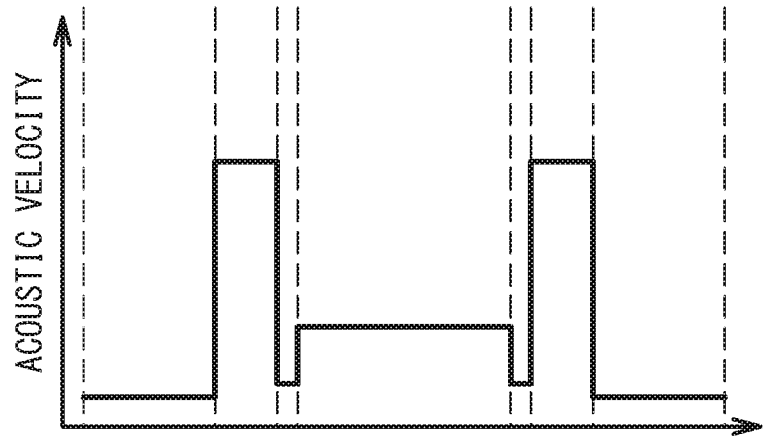
FIG. 2B illustrates acoustic velocity.

FIG. 2A is a cross-sectional view taken along line B-B in FIG. 1A, and FIG. 2B illustrates acoustic velocity. As illustrated in FIG. 2A, the both edges of the overlap region 15 in the Y direction (the extension direction of the electrode finger 14) are defined as edge regions 16$b$, and the region sandwiched between the edge regions 16$b$ is defined as a central region 16$a$. The additional film 26 is located on the overlap region 15 and the gap regions 17. The film thickness t2 of the additional film 26 in the edge regions 16$b$ is made to be greater than the film thickness t1 of the additional film 26 in the central region 16$a$ and the gap regions 17. As illustrated in FIG. 2B, the acoustic velocity in the gap regions 17 is greater than the acoustic velocity in the overlap region 15. Accordingly, the acoustic wave is confined in the overlap region 15. Furthermore, since the additional film 26 in the edge regions 16$b$ is thicker than the additional film 26 in the central region 16$a$, the acoustic velocity in the edge regions 16$b$ is less than the acoustic velocity in the central region 16$a$. This structure makes the intensity distribution of a fundamental transverse-mode in the overlap region 15 flat in the Y direction. Furthermore, the coupling coefficient of a high-order transverse-mode decreases. Accordingly, a piston mode that reduces transverse-mode spurious can be achieved.

The difference between the film thicknesses t2 and t1 is determined by the material properties such as the density, the Young's modulus, and the acoustic velocity of the additional film 26. For example, when the additional film 26 is made of tantalum oxide, the film thickness difference t2−t1 is preferably approximately 0.8% or greater in normalized film thickness calculated by dividing the film thickness by the wavelength $\lambda$ (the pitch of the electrode fingers).

When the piezoelectric substrate 10 is a lithium niobate substrate, for example, a rotated Y-cut lithium niobate substrate is used. At a rotated Y-cut angle of 127.86°, the electromechanical coupling coefficient of a Rayleigh wave reaches a maximum. In the simulation with the Campbell&Jones method, the electromechanical coupling coefficient of a Rayleigh wave is greater than the electromechanical coupling coefficient of a leaky wave in a range of 120° to 140° of a rotated Y-cut angle. Thus, the Rayleigh wave becomes a primary mode, and the leaky wave becomes an unnecessary wave. When a Rayleigh wave is a primary mode, the rotated Y-cut angle is preferably 120° or greater and 140° or less. In addition, considering the variability in manufacturing with respect to 127.86°, the rotated Y-cut angle is preferably 126° or greater and 130° or less.

In a lithium niobate substrate, the electromechanical coupling coefficient of a leaky wave reaches a maximum at a rotated Y-cut angle of 0°. Within a range of −10° to 10° of a rotated Y-cut angle, the electromechanical coupling coefficient of a leaky wave is greater than the electromechanical coupling coefficient of a Rayleigh wave. Thus, the leaky wave becomes a primary mode, and the Rayleigh wave becomes an unnecessary wave. When a leaky wave is a primary mode, the rotated Y-cut angle is preferably −10° or greater and 10° or less. In addition, considering the variability in manufacturing, the rotated Y-cut angle is preferably −3° or greater and 3° or less.

Used as the dielectric film 24 is a $SiO_2$ film or a SiOF film. The temperature coefficients of frequency (TCFs) of the $SiO_2$ film and the SiOF film are opposite in sign to those of a lithium niobate substrate and a lithium tantalate substrate. Thus, the dielectric film 24 acts as a compensation film that reduces the TCF of the acoustic wave resonator. The dielectric film 24 may be a silicon oxide film containing an element other than fluorine. The dielectric film 24 preferably has a TCF opposite in sign to the TCF of the piezoelectric substrate 10. Even when the TCF of the dielectric film 24 has the same sign as the TCF of the piezoelectric substrate 10, if the TCF is closer to zero than the TCF of the piezoelectric substrate 10 is, the temperature compensation effect is produced.

When the additional film 26 is used to make the acoustic velocities different between the edge region 16$b$ and the central region 16$a$, the change in acoustic velocity with respect to the film thickness of the additional film 26 is preferably large. In addition, as described later, when the additional film 26 is used as a frequency adjusting film, the change in resonant frequency with respect to the film thickness of the additional film 26 is preferably large. Considering the above discussion, the additional film 26 is preferably made of a material with a high density. Thus, the additional film 26 is made of a material with a density greater than that of the dielectric film 24.

Figure 3A:
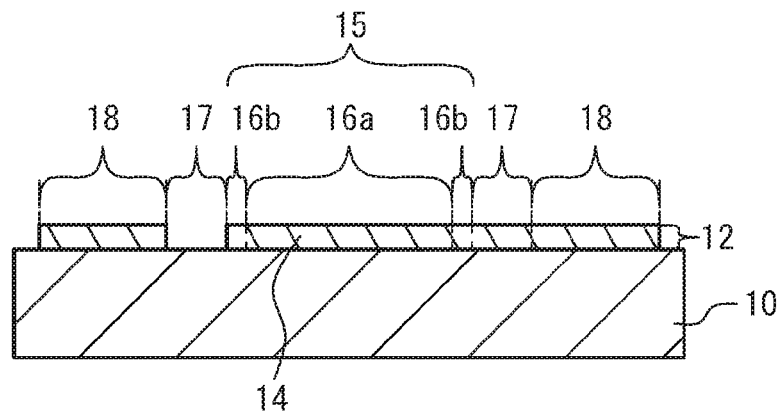
FIG. 3A through FIG. 3C are cross-sectional views (No. 1) illustrating a method of fabricating the acoustic wave resonator in accordance with the first embodiment.
Figure 3B:
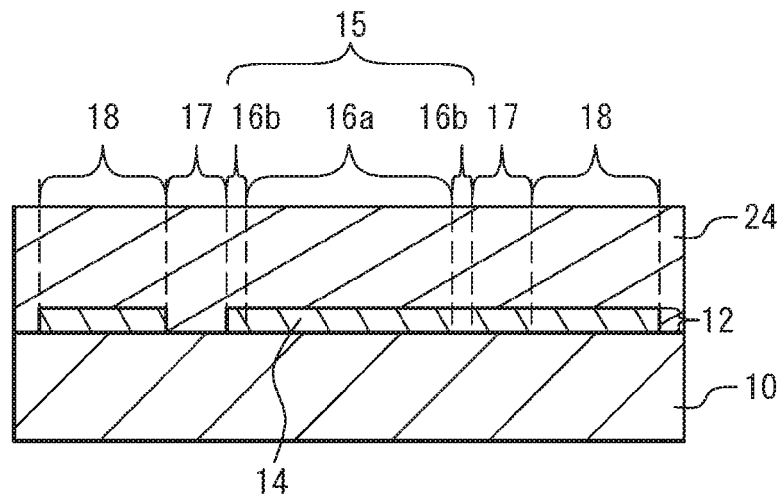
Figure 3C:
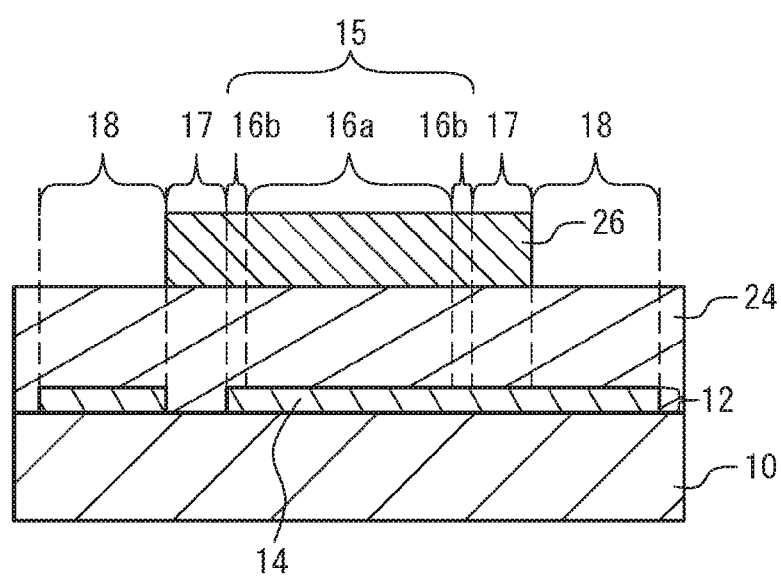

Next, a method of fabricating the acoustic wave resonator of the first embodiment will be described. FIG. 3A through FIG. 5 are cross-sectional views illustrating the method of fabricating the acoustic wave resonator in accordance with the first embodiment. As illustrated in FIG. 3A, the metal film 12 is formed on the piezoelectric substrate 10. The metal film 12 forms the IDT 21 and the reflectors 22. The IDT 21 and the reflectors 22 are formed by, for example, sputtering and etching, or evaporation and liftoff. As illustrated in FIG. 3B, the dielectric film 24 is formed on the piezoelectric substrate 10 so as to cover the IDT 21 and the reflectors 22. The dielectric film 24 is formed by, for example, Chemical Vapor Deposition (CVD) or sputtering. The upper surface of the dielectric film 24 is planarized by, for example, etching or Chemical mechanical Polishing (CMP). As illustrated in FIG. 3C, the additional film 26 is formed on the dielectric film 24. The additional film 26 is formed by, for example, sputtering and etching, or evaporation and liftoff.

Figure 4A:
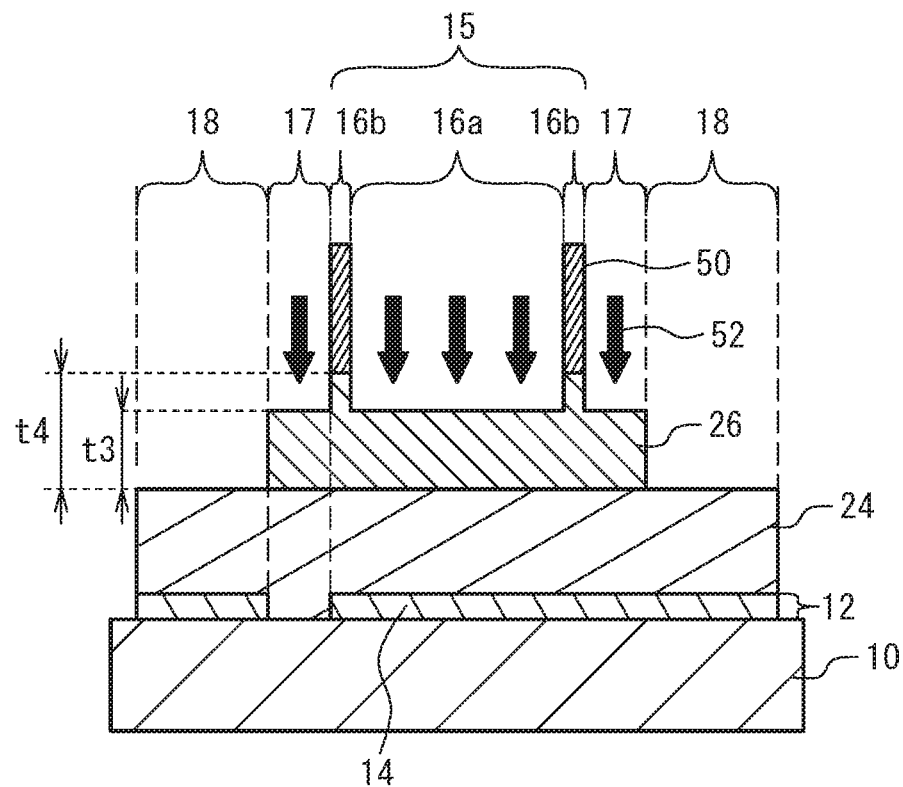
FIG. 4A and FIG. 4B are cross-sectional views (No. 2) illustrating the method of fabricating the acoustic wave resonator in accordance with the first embodiment.
Figure 4B:
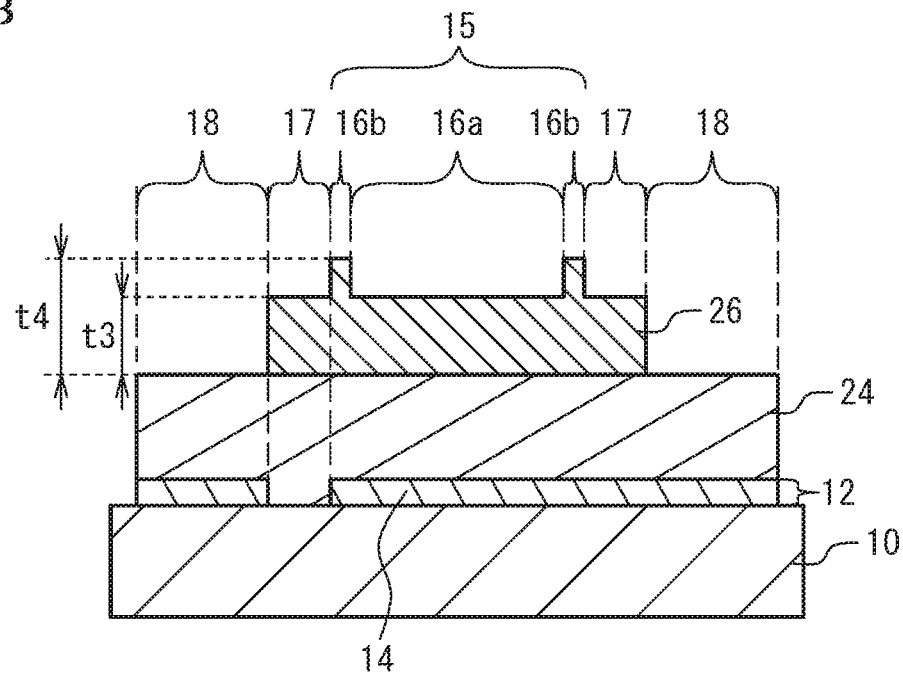

As illustrated in FIG. 4A, a mask layer 50 is formed on the additional film 26. The mask layer 50 is made of, for example, a photoresist. The mask layer 50 is formed in the edge regions 16b, but are not formed in other regions. The additional film 26 is etched using the mask layer 50 as a mask as indicated by arrows 52. This process makes the film thickness t3 of the additional film 26 in the central region 16a and the gap regions 17 less than the film thickness t4 of the additional film 26 in the edge regions 16b. As illustrated in FIG. 4B, the mask layer 50 is removed. Then, for example, the resonant frequency of the acoustic wave resonator is measured. Alternatively, the film thickness of the additional film 26 is measured.

Figure 5:
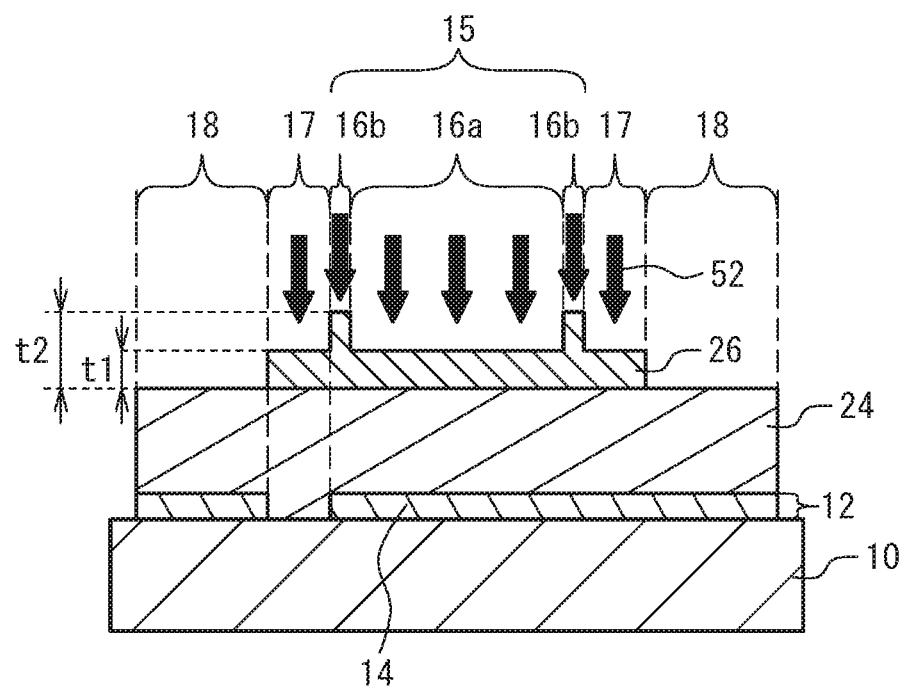
FIG. 5 is a cross-sectional view (No. 3) illustrating the method of fabricating the acoustic wave resonator in accordance with the first embodiment.

As illustrated in FIG. 5, to adjust, for example, the resonant frequency of the acoustic wave resonator, the upper surface of the additional film 26 is etched. This process makes the film thickness of the additional film 26 in the central region 16a and the gap regions 17 be the film thickness t1, and makes the film thickness of the additional film 26 in the edge regions 16b be the film thickness t2. The entire surface of the upper surface of the additional film 26 is uniformly etched. This process reduces the thickness of the additional film 26 substantially uniformly. Accordingly, the film thickness difference t2−t1 becomes approximately the film thickness difference t4−t3. The etching in FIG. 4A and FIG. 5 is performed by, for example, dry etching. The dry etching is performed by, for example, reactive ion etching using $CF_4$, $CHF_3$, $C_3F_8$ or $SF_6$ as an etching gas, or ion milling using Ar or $O_2$ gas. Wiring lines interconnecting surface acoustic wave resonators or the like are then formed.

The acoustic wave resonator of the first embodiment was made to measure the admittance characteristic and the conductance characteristic. The materials and dimensions of the acoustic wave resonator are as follows.

Piezoelectric substrate 10: 128° rotated Y-cut lithium niobate substrate
Pitch λ of the electrode fingers 14: 3.84 μm (corresponding to an operation frequency of approximately 900 MHz)
Number of pairs in the IDT 21: 100 pairs
Aperture length: 20λ
Edge region width: 0.95λ
Material of the metal film 12: Copper
Film thickness of the metal film 12: 275 nm
Material of the dielectric film 24: $SiO_2$
Film thickness of the dielectric film 24: 1200 nm
Material of the additional film 26: Tantalum oxide The film thickness of the additional film 26 before the frequency adjustment (in the state of FIG. 4A) is as follows.
Film thickness t3: 14 nm
Film thickness t4: 55 nm The film thickness of the additional film 26 after the frequency adjustment (in the state of FIG. 5) is as follows.
Film thickness t1: 4 nm
Film thickness t2: 45 nm In FIG. 5, the additional film 26 is etched by 10 nm.

Figure 6:
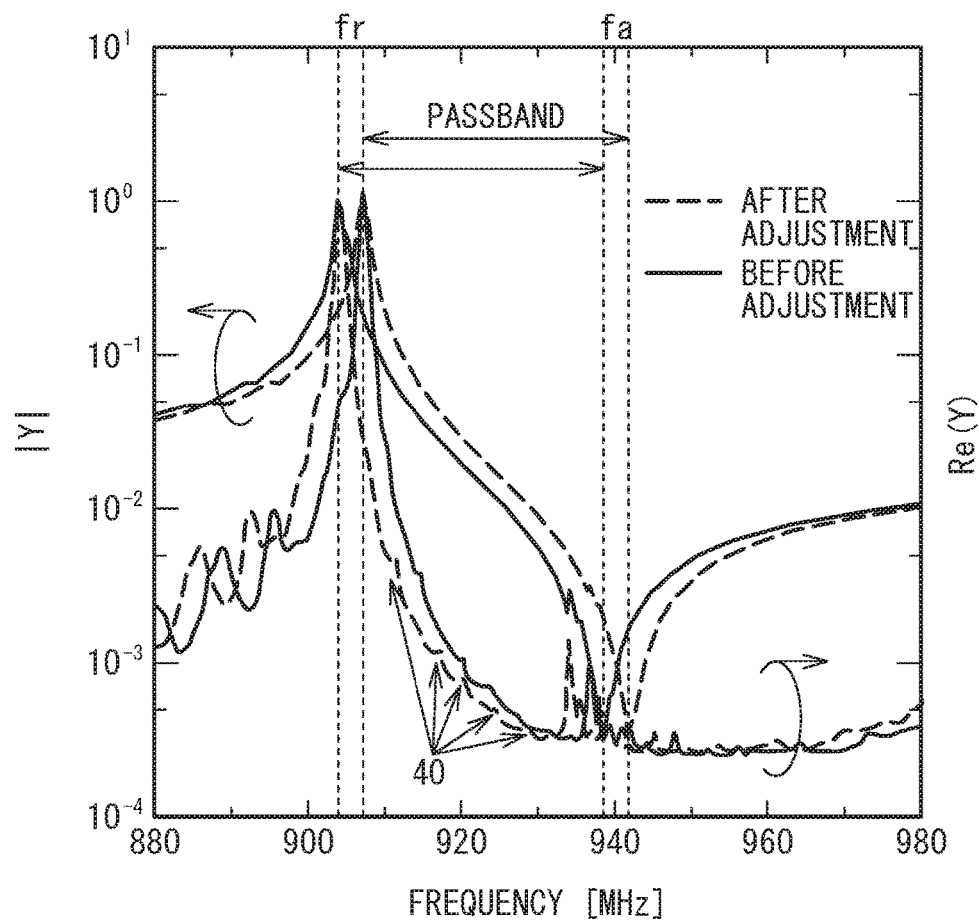
FIG. 6 illustrates admittance |Y| and conductance Re(Y) before and after frequency adjustment in the first embodiment.

FIG. 6 illustrates admittance |Y| and conductance Re(Y) before and after the frequency adjustment in the first embodiment. In FIG. 6, the dashed line indicates values before the frequency adjustment and the solid line indicates values after the frequency adjustment. The frequency band between the resonant frequency fr and the antiresonant frequency fa is indicated as a passband. As indicated by the admittance characteristic in FIG. 6, 10-nm etching of the additional film 26 shifts both the resonant frequency fr and the antiresonant frequency fa to higher frequencies by approximately 3 MHz. In addition, as indicated by the conductance characteristic, transverse-mode spurious 40 in the passband remains unchanged before and after the frequency adjustment, and is very small. As described above, in the first embodiment, the frequency adjustment can be performed while the transverse-mode spurious is reduced.

As described above, in the first embodiment, the additional film 26 with a density greater than that of the dielectric film 24 is located on the dielectric film 24 in the overlap region 15. The film thickness of the additional film 26 in the edge regions 16b is greater than the film thickness of the additional film 26 in the central region 16a.

Figure 7A:
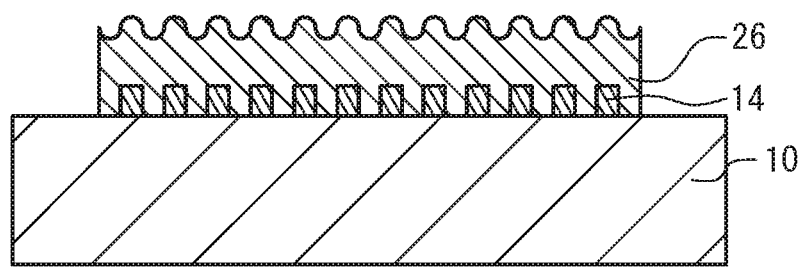
FIG. 7A and FIG. 7B are cross-sectional views of an acoustic wave resonator in accordance with a first comparative example before and after the frequency adjustment, respectively.
Figure 7B:
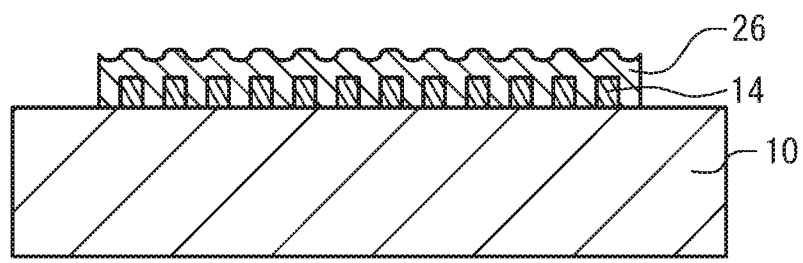

For comparison, a comparative example will be examined. FIG. 7A and FIG. 7B are cross-sectional views of an acoustic wave resonator in accordance with a first comparative example in the propagation direction of the acoustic wave of the acoustic wave resonator before and after the frequency adjustment, respectively. As illustrated in FIG. 7A and FIG. 7B, the acoustic wave resonator of the first comparative example does not include the dielectric film 24. As illustrated in FIG. 7A, unevenness corresponding to the electrode fingers 14 is formed on the upper surface of the additional film 26. As illustrated in FIG. 7B, if the additional film 26 is etched in this state and the frequency adjustment is performed, the upper surface of the additional film 26 is non-uniformly etched. Accordingly, the etching amount of the additional film 26 becomes non-uniform before and after the etching of the additional film 26. Therefore, the degree of generation of transverse-mode spurious will change.

In contrast, in the first embodiment, the additional film 26 with a density greater than that of the dielectric film 24 is located on the dielectric film 24 in the overlap region 15. Thus, compared to a case where the additional film 26 is directly formed on the electrode fingers 14 as in the first comparative example, the additional film 26 can be uniformly etched in FIG. 5. Accordingly, the frequency adjustment can be performed while transverse-mode spurious is reduced.

To uniformly etch the additional film 26, the upper surface of the dielectric film 24 is preferably flat. For example, the upper surface of the dielectric film 24 is preferably more flat than unevenness due to the electrode fingers 14 on the piezoelectric substrate 10.

Figure 8:
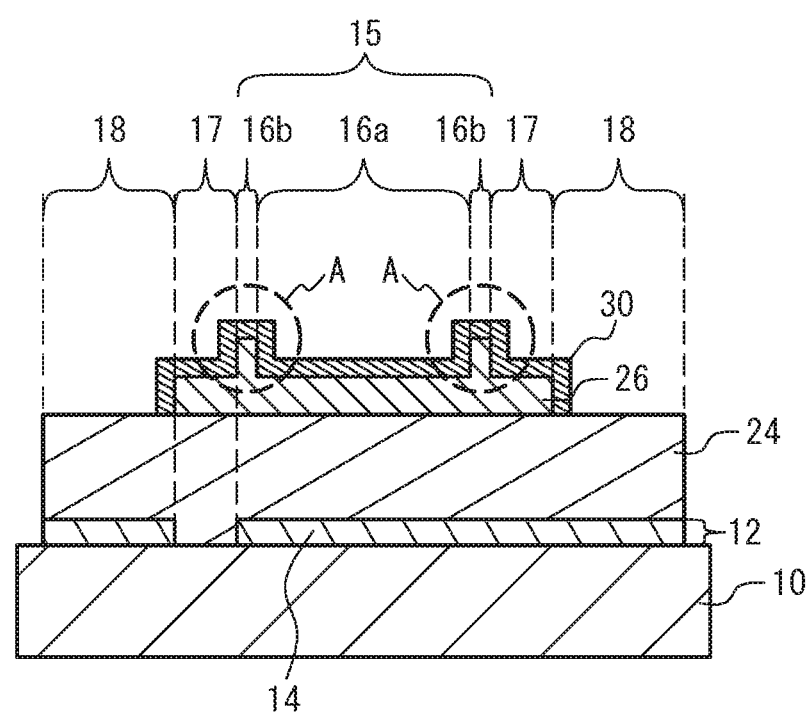
FIG. 8 is a cross-sectional view of an acoustic wave resonator in accordance with a second comparative example.

FIG. 8 is a cross-sectional view of an acoustic wave resonator in accordance with a second comparative example. As illustrated in FIG. 8, a frequency adjusting film 30 is located on the additional film 26. Other structures are the same as those of the first embodiment, and the description thereof is thus omitted. As illustrated in FIG. 8, it may be considered to form the frequency adjusting film 30 on the additional film 26 for the frequency adjustment. However, in this case, as indicated by regions A, the regions in which the film thickness is thick are formed at the both sides of the edge regions 16b. Thus, the degree of generation of transverse-mode spurious changes before and after the forming of the frequency adjusting film.

In the second comparative example, a boundary face between the additional film 26 and the frequency adjusting film 30 is formed. In addition, when the additional film 26 is formed in several steps, the additional film 26 includes a boundary face. In this case, in the etching in FIG. 5, the additional film 26 is non-uniformly etched. Thus, the degree of generation of transverse-mode spurious changes. In the first embodiment, the additional film 26 is a single film not including the boundary face. Thus, compared to a case where the additional film 26 includes a boundary face, the occurrence of transverse-mode spurious due to the frequency adjustment can be reduced. In addition, since no boundary face exists in the additional film 26, acoustic loss can be reduced. Furthermore, peeling in the additional film 26 can be inhibited.

When the piezoelectric substrate 10 is a lithium niobate substrate, the dielectric film 24 is a silicon oxide film or a silicon oxide film containing impurities for enhancing the temperature compensation effect. This structure allows the dielectric film 24 to be used as a temperature compensation film.

Figure 9:
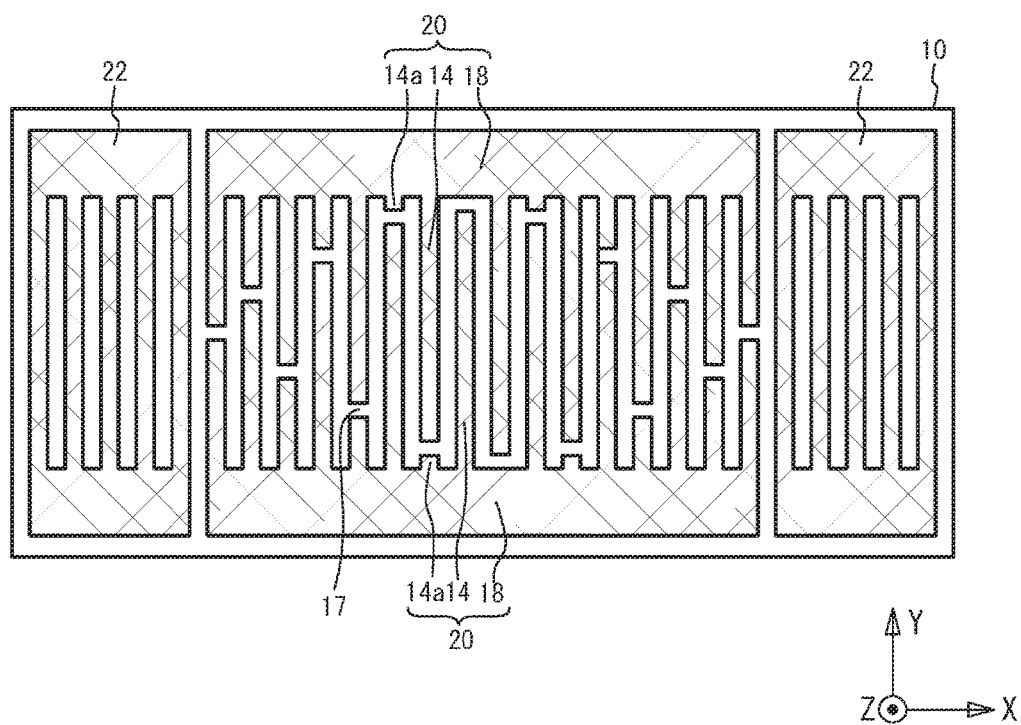
FIG. 9 is a plan view of a sample of which the admittance was measured.

Next, change in admittance before and after the forming of the additional film 26 was measured with use of the structure that the additional film 26 is made of tantalum oxide or niobium oxide. FIG. 9 is a plan view of a sample of which the admittance was measured. As illustrated in FIG. 9, the comb-shaped electrode 20 of the IDT 21 includes dummy electrode fingers 14a. The electrode fingers 14 of one of the comb-shaped electrodes 20 and the dummy electrode fingers 14a of the other face each other in the Y direction. The region between the electrode fingers 14 and the dummy electrode fingers 14a is the gap region 17. The locations of the gap regions 17 in the Y direction are modulated with respect to the positions in the X direction. Transverse-mode spurious is reduced in such an apodized acoustic wave resonator.

The conditions of the sample made are as follows.
Piezoelectric substrate 10: 128° rotated Y-cut lithium niobate substrate
Pitch λ of the electrode fingers 14: 3.84 μm
Number of pairs in the IDT 21: 55 pairs
Aperture length: 35λ,
Film thickness of tantalum oxide: 11.4 nm
Film thickness of niobium oxide: 27.9 nm
The edge region like the first embodiment is not provided.

Figure 10A:
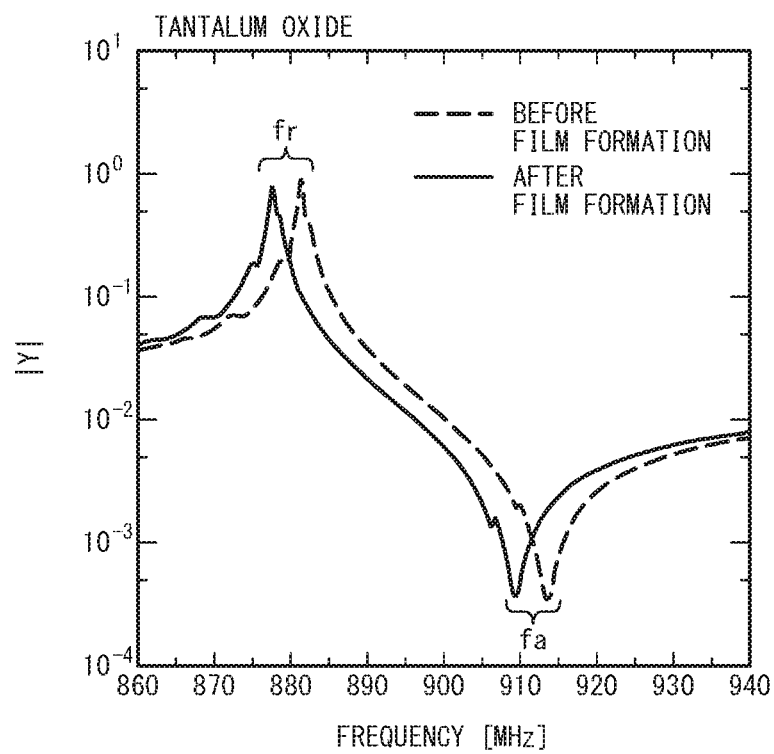
FIG. 10A and FIG. 10B illustrate admittance before and after the forming of an additional film.
Figure 10B:
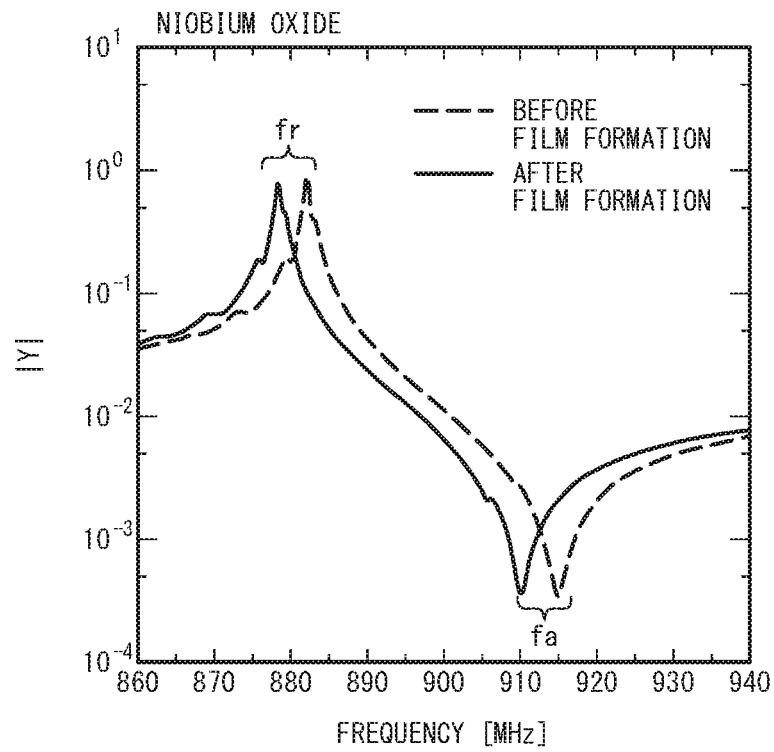

FIG. 10A and FIG. 10B illustrate admittance before and after the forming of the additional film. FIG. 10A presents a sample in which the additional film is made of tantalum oxide, and FIG. 10B presents a sample in which the additional film is made of niobium oxide. Both in FIG. 10A and FIG. 10B, both the resonant frequency fr and the antiresonant frequency fa shift to lower frequencies by approximately 10 MHz.

Table 1 lists frequency sensitivity when the additional film 26 is made of tantalum oxide or niobium oxide. The frequency sensitivity is represented by frequency change with respect to a 1 nm change of the film thickness of the additional film 26. The frequency sensitivity $\Delta fr$ of the resonant frequency fr, the frequency sensitivity $\Delta fa$ of the antiresonant frequency fa, and the frequency sensitivity $\Delta fr-fa/2$ of (fr-fa)/2 of niobium oxide are approximately a half of those of tantalum oxide.

TABLE 1

|  | Tantalum oxide | Niobium oxide |
|---|---|---|
| $\Delta fr$ [MHz/nm] | −0.325 | −0.134 |
| $\Delta fa$ [MHz/nm] | −0.365 | −0.170 |
| $\Delta fr - fa/2$ [MHz/nm] | −0.345 | −0.152 |

When the additional film 26 is made of tantalum oxide, according to Table 1, the amount of change in the film thickness of the additional film 26 when the frequency adjustment of 1 MHz is performed becomes the reciprocal of the frequency sensitivity, and is approximately 3.0 nm. When the additional film 26 is made of niobium oxide, according to Table 1, the amount of change in the film thickness of the additional film 26 when the frequency adjustment of 1 MHz is performed is approximately 6.6 nm. Furthermore, when the operation frequency doubles, the amount of change in the film thickness also doubles. In tantalum oxide, the frequency rapidly changes in the small film thickness, and thus the frequency adjustment is difficult. In niobium oxide, since the frequency sensitivity is small, even when the operation frequency becomes higher, the frequency adjustment is easy. As described above, the material of the additional film 26 is designed taking the operation frequency and the range of the frequency adjustment into consideration.

For example, when a lithium niobate substrate is used as the piezoelectric substrate 10, and a silicon oxide film or a silicon oxide film containing impurities is used as the dielectric film 24, the additional film 26 is preferably made of tantalum oxide or niobium oxide. As tantalum oxide, tantalum oxide of which the $Ta_2O_5$ or oxygen composition ratio is an off-stoichiometric composition may be used. As niobium oxide, niobium oxide of which the $Nb_2O_5$ or oxygen composition ratio is an off-stoichiometric composition may be used.

Figure 11A:
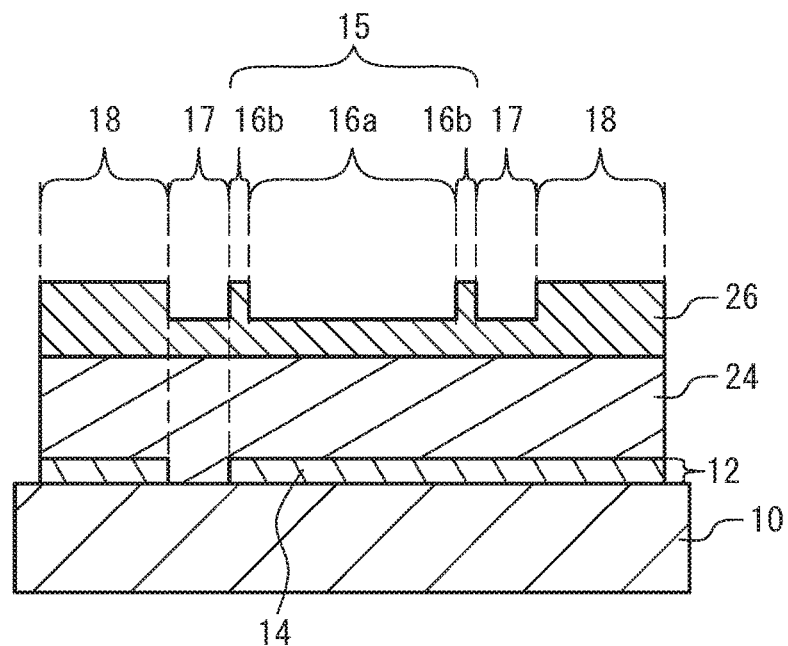
FIG. 11A and FIG. 11B are cross-sectional views of acoustic wave resonators in accordance with first and second variations of the first embodiment, respectively.
Figure 11B:
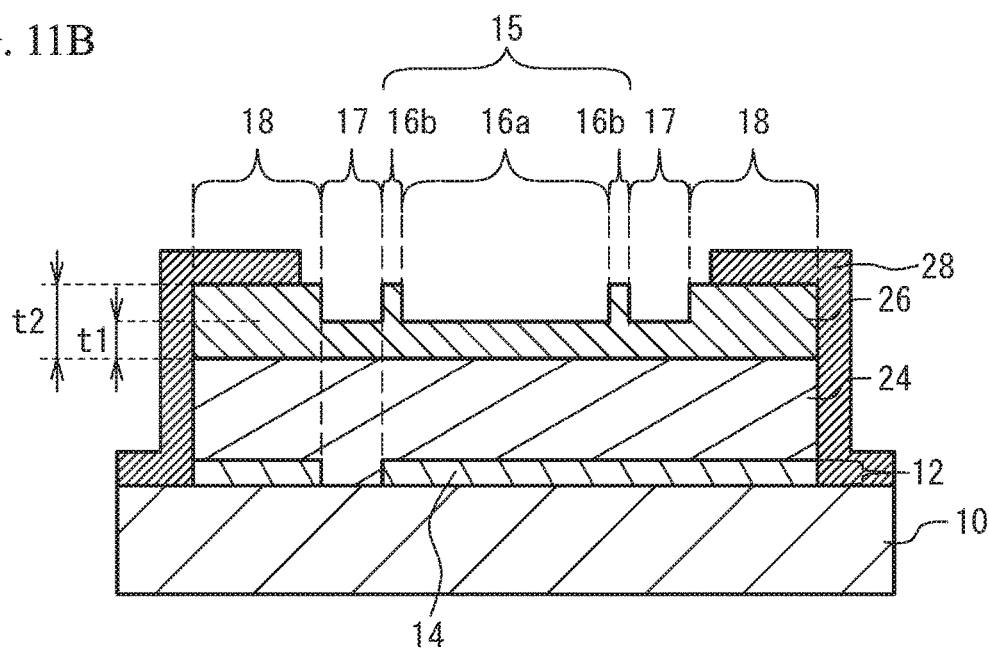

FIG. 11A and FIG. 11B are cross-sectional views of acoustic wave resonators in accordance with first and second variations of the first embodiment, respectively. As illustrated in FIG. 11A, the additional film 26 is located on the dielectric film 24 of the bus bar 18. The forming of the additional film 26 above the bus bar 18 makes the acoustic velocity in a bus bar region in which the bus bar 18 is formed slower. Accordingly, the energy of unnecessary waves in a high-order transverse mode concentrates in the bus bar region. Since the confinement of unnecessary waves in the high-order transverse-mode into the gap region 17 is weakened, transverse-mode spurious can be reduced. To make the acoustic velocity in the bus bar region slower, the film thickness of the additional film 26 in the bus bar 18 is preferably equal to or greater than the film thickness of the additional film 26 in the edge region 16b. The additional film 26 above the bus bar 18 may be located above the entire of the bus bar 18 in the Y direction, but may be located above only a part of the bus bar 18 (for example, a part at the gap region 17 side).

As illustrated in FIG. 11B, a metal film 28 is located on the additional film 26 above the bus bar 18. The metal film 28 is, for example, a part of a wiring line interconnecting acoustic wave resonators. This structure can make the acoustic velocity above the bus bar 18 yet slower, and can reduce transverse-mode spurious more.

Examined was a condition with which the electromechanical coupling coefficient of a leaky wave, which is an unnecessary wave, becomes small and spurious due to the leaky wave can be reduced when the piezoelectric substrate 10 is a rotated Y-cut X-propagation lithium niobate substrate and the dielectric film 24 is a silicon oxide ($SiO_2$) film. When a cut angle is made to range from 121° to 133° (0°, 31° to 43°, 0° in the Euler angle) and the film thickness of the metal film 12 is made to range from 0.06λ to 0.08λ, it was found that the TCF becomes practically zero when the film thickness of the dielectric film 24 is made to range from 0.29λ to 0.35λ. Here, the TCF of practically zero is, for example, ±5 ppm/° C. It was found that the electromechanical coupling coefficient of a leaky wave can be made to be 0.006% or less by making the cut angle 124° to 126° (0°, 34° to 36°, 0° in the Euler angle). Therefore, spurious due to a leaky wave can be reduced.

A description will be given of an example that uses the filter for a transmit filter and a receive filter for LTE band 13 (transmit band: 746 MHz to 756 MHz, receive band: 777 MHz to 787 MHz) complying with LTE standards (E-UTRA Operating Band).

The piezoelectric substrate 10 is a 125° Y-cut X-propagation lithium niobate substrate. The metal film 12 is formed of a titanium film with a film thickness of 78 nm, a copper film with a film thickness of 215 nm (0.047λ), and a chrome film with a film thickness of 10 nm stacked in this order from the piezoelectric substrate 10 side. The pitch λ of the electrode fingers 14 is 4.53 μm. The dielectric film 24 is a $SiO_2$ film with a film thickness of 1448 nm (0.32 k: the film thickness on the electrode finger 14). The duty ratio of the electrode finger 14 is 0.5.

In another example, the piezoelectric substrate 10 is a 128° Y-cut X-propagation lithium niobate substrate. The metal film 12 is formed of a titanium film with a film thickness of 78 nm, a copper film with a film thickness of 495 nm (0.11λ), and a chrome film with a film thickness of 10 nm stacked in this order from the piezoelectric substrate 10 side. The pitch λ of the electrode fingers 14 is 4.53 μm. The dielectric film 24 is a $SiO_2$ film with a film thickness of 1510 nm (0.33λ: the film thickness on the electrode finger 14). The duty ratio of the electrode finger 14 is 0.5.

Second Embodiment

Figure 12A:
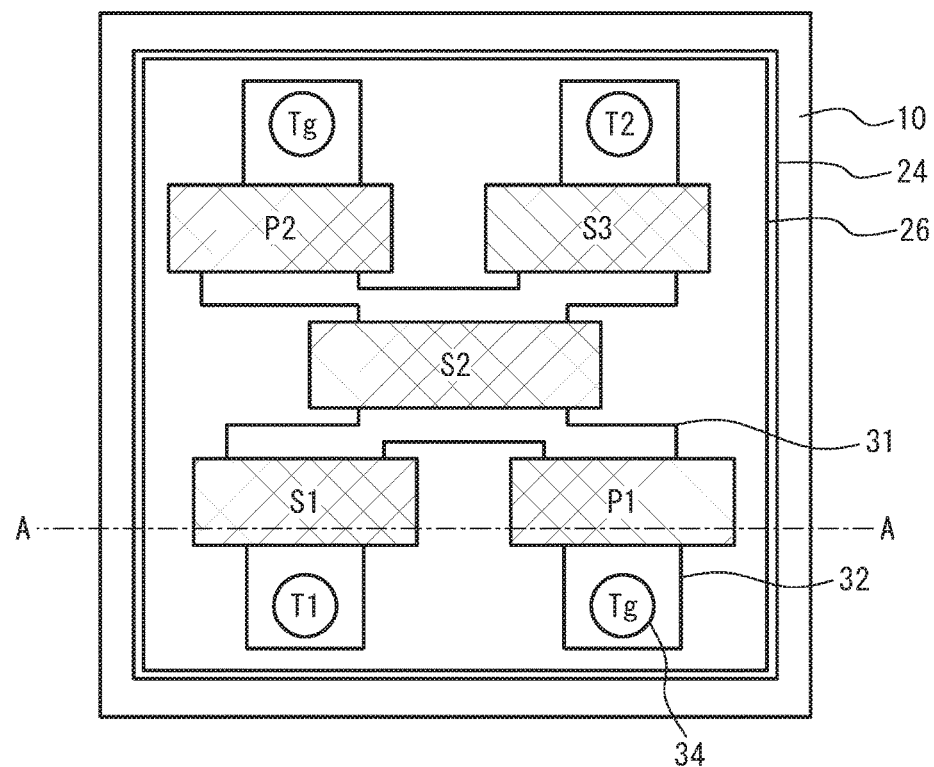
FIG. 12A is a plan view of a filter in accordance with a second embodiment.
Figure 12B:
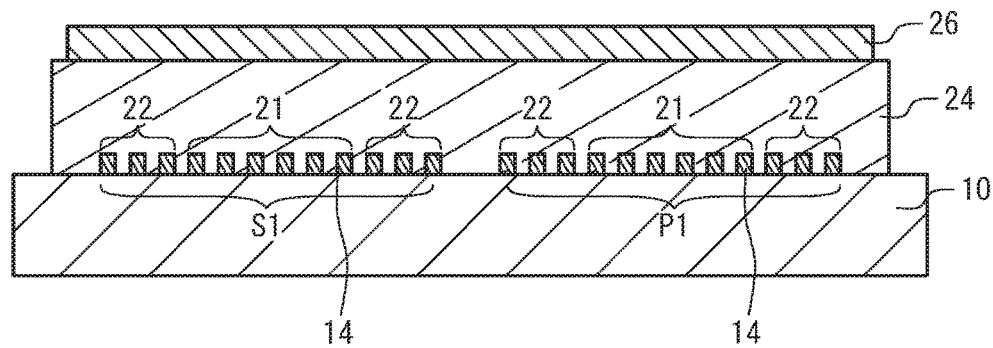
FIG. 12B is a cross-sectional view taken along line A-A in FIG. 12A.

A second embodiment uses the acoustic wave resonator according to any one of the first embodiment and the variations thereof for a filter. FIG. 12A is a plan view of a filter in accordance with the second embodiment, and FIG. 12B is a cross-sectional view taken along line A-A in FIG. 12A. FIG. 12A is a plan view that omits the illustration of the additional film 26 and the dielectric film 24. As illustrated in FIG. 12A and FIG. 12B, series resonators S1 through S3 and parallel resonators P1 and P2 are formed on the piezoelectric substrate 10. Wiring lines 31 and pads 32 are located on the piezoelectric substrate 10. Bumps 34 are located on the pads 32. The wiring lines 31 and the pads 32 are formed of a metal layer such as a copper layer, a gold layer, or an aluminum layer. The bumps 34 are gold bumps, copper bumps, or solder bumps. The wiring lines 31 electrically interconnect the acoustic wave resonators. The pad 32 electrically connects the acoustic wave resonator and the bump 34. The bumps 34 function as an input terminal T1, an output terminal T2, and ground terminals Tg.

One or more series resonators S1 through S3 are connected in series between the input terminal T1 and the output terminal T2 through the wiring lines 31. One or more parallel resonators P1 and P2 are connected in parallel between the input terminal T1 and the output terminal T2 through the wiring lines 31. The IDT 21 and the reflectors 22 of each acoustic wave resonator are covered with the dielectric film 24. The additional film 26 is located on the dielectric film 24. The cross-sectional shape of the additional film 26 is the same as that of the first embodiment and the variations thereof. The dielectric film 24 as a single film that is not separated and is consecutive covers the acoustic wave resonators. The additional film 26 as a single film that is not separated and is consecutive covers the acoustic wave resonators. At least one of the dielectric film 24 and the additional film 26 may be a film separated with respect to each acoustic wave resonator.

At least one of the one or more series resonators S1 through S3 and the one or more parallel resonators P1 and P2 may be the acoustic wave resonator according to any one of the first embodiment and the variations thereof. A filter including the acoustic wave resonator according to any one of the first embodiment and the variations thereof may be a multimode filter in addition to a ladder-type filter.

Figure 13:
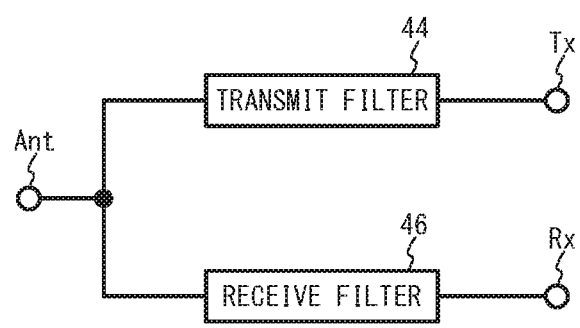
FIG. 13 is a circuit diagram of a duplexer in accordance with a first variation of the second embodiment.

FIG. 13 is a circuit diagram of a duplexer in accordance with a first variation of the second embodiment. As illustrated in FIG. 13, a transmit filter 44 is connected between a common terminal Ant and a transmit terminal Tx. A receive filter 46 is connected between the common terminal Ant and a receive terminal Rx. The transmit filter 44 transmits signals in the transmit band to the common terminal Ant as transmission signals among signals input from the transmit terminal Tx, and suppresses signals with other frequencies. The receive filter 46 transmits signals in the receive band to the receive terminal Rx as reception signals among signals input from the common terminal Ant, and suppresses signals with other frequencies. At least one of the transmit filter 44 or the receive filter 46 may be the filter of the second embodiment. A duplexer has been described as an example, but the filter of the second embodiment may be used in a multiplexer such as a triplexer or a quadplexer.

Although the embodiments of the present invention have been described in detail, it is to be understood that the various change, substitutions, and alterations could be made hereto without departing from the spirit and scope of the invention.

What is claimed is:
1. An acoustic wave resonator comprising:
   a piezoelectric substrate;
   an IDT that is located on the piezoelectric substrate and includes a pair of comb-shaped electrodes facing each other, each of the pair of comb-shaped electrodes including: electrode fingers exciting an acoustic wave; and a bus bar to which the electrode fingers are connected;
   a dielectric film that is located on the piezoelectric substrate in an overlap region, in which the electrode fingers of one of the pair of comb-shaped electrodes and the electrode fingers of another one of the pair of comb-shaped electrodes overlap, so as to cover the electrode fingers; and
   an additional film that is located on the dielectric film in the overlap region and has a density greater than a density of the dielectric film, and of which a film thickness in edge regions corresponding to both edges of the overlap region in an extension direction of the electrode fingers is greater than a film thickness in a central region sandwiched between the edge regions in the overlap region, wherein the additional film is a single film that includes no boundary face.

2. The acoustic wave resonator according to claim 1, wherein an upper surface of the dielectric film is flat.

3. The acoustic wave resonator according to claim 1, wherein the piezoelectric substrate is a lithium niobate substrate, and the dielectric film is a silicon oxide film or a silicon oxide film containing an impurity.

4. The acoustic wave resonator according to claim 3, wherein the additional film is a niobium oxide film.

5. The acoustic wave resonator according to claim 3, wherein the additional film is a tantalum oxide film.

6. A filter comprising:
the acoustic wave resonator according to claim 1.

7. A multiplexer comprising:
the filter according to claim 6.

8. An acoustic wave resonator comprising:
a piezoelectric substrate;
an IDT that is located on the piezoelectric substrate and includes a pair of comb-shaped electrodes facing each other, each of the pair of comb-shaped electrodes including: electrode fingers exciting an acoustic wave; and a bus bar to which the electrode fingers are connected;
a dielectric film that is located on the piezoelectric substrate in an overlap region, in which the electrode fingers of one of the pair of comb-shaped electrodes and the electrode fingers of another one of the pair of comb-shaped electrodes overlap, so as to cover the electrode fingers; and
an additional film that is located on the dielectric film in the overlap region and has a density greater than a density of the dielectric film, and of which a film thickness in edge regions corresponding to both edges of the overlap region in an extension direction of the electrode fingers is greater than a film thickness in a central region sandwiched between the edge regions in the overlap region,
wherein the dielectric film and the additional film are located in a region where the bus bar is formed, and a film thickness of the additional film in the region where the bus bar is formed is equal to or greater than a film thickness of the additional film in the edge regions.

9. The acoustic wave resonator according to claim 8, wherein the additional film is a single film that includes no boundary face.

10. The acoustic wave resonator according to claim 8, further comprising:

a metal film located on the additional film in the region where the bus bar is formed.

11. A filter comprising:
the acoustic wave resonator according to claim 8.

12. A multiplexer comprising:
the filter according to claim 11.

13. A method of fabricating an acoustic wave resonator, the method comprising:
forming an IDT including a pair of comb-shaped electrodes facing each other on a piezoelectric substrate, each of the pair of comb-shaped electrodes including: electrode fingers exciting an acoustic wave; and a bus bar to which the electrode fingers are connected;
forming a dielectric film on the piezoelectric substrate in an overlap region, in which the electrode fingers of one of the pair of comb-shaped electrodes and the electrode fingers of another one of the pair of comb-shaped electrodes overlap, so that the dielectric film covers the electrode fingers;
forming, on the dielectric film in the overlap region, an additional film that has a density greater than a density of the dielectric film and of which a film thickness in edge regions corresponding to both edges of the overlap region in an extension direction of the electrode fingers is greater than a film thickness in a central region sandwiched between the edge regions in the overlap region; and
thinning the additional film substantially uniformly,
wherein the additional film is a single film that includes no boundary face.

* * * * *